United States Patent [19]

Parmentier

[11] 4,361,756
[45] Nov. 30, 1982

[54] PERSONAL CARD COMPRISING A SAFETY SWITCH

[75] Inventor: Paul Parmentier, Cailly-sur-Eure, France

[73] Assignee: U.S. Philips Corporation, New York, N.Y.

[21] Appl. No.: 216,110

[22] Filed: Dec. 15, 1980

[30] Foreign Application Priority Data

Dec. 19, 1979 [FR] France .................................. 79 31144

[51] Int. Cl.³ .............................................. G06K 19/06
[52] U.S. Cl. .................................... 235/487; 235/380; 235/488; 235/492; 235/493; 235/494
[58] Field of Search ............... 235/487, 488, 492, 493, 235/494, 380; 340/825.31, 825.32, 825.33

[56] References Cited

U.S. PATENT DOCUMENTS 4,256,955  3/1981  Giraud ................................ 235/380

Primary Examiner—Harold I. Pitts
Attorney, Agent, or Firm—James J. Cannon, Jr.

[57] ABSTRACT

A personal card having a carrier on which an integral solid-state memory is provided in which a bit combination which is intended for identification is stored. The memory is connected in series with a safety switch which can be switched on by a control device for the processing of the bit combination by an electronic processing device such as a computer.

5 Claims, 6 Drawing Figures

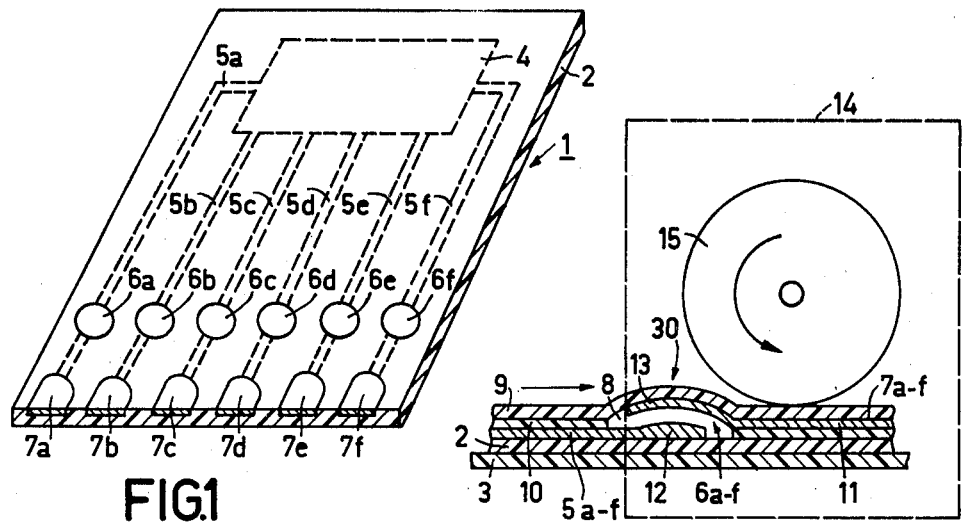
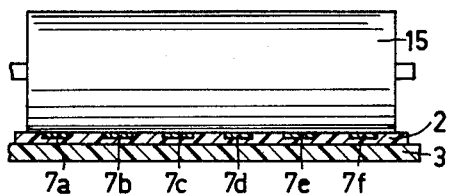
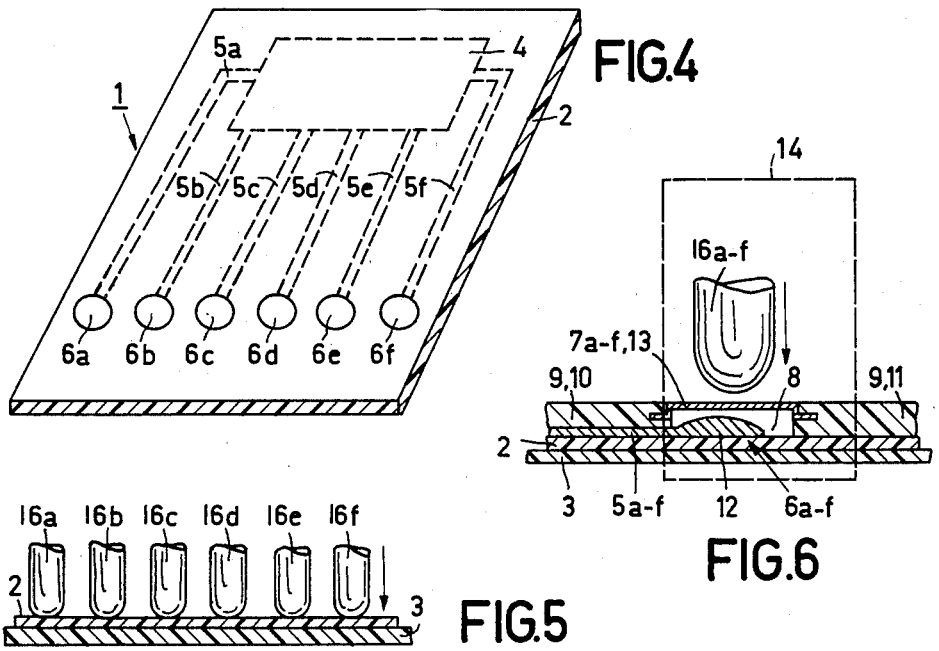

PERSONAL CARD COMPRISING A SAFETY SWITCH

BACKGROUND OF THE INVENTION

The invention relates to a personal card comprising a carrier on which a bit combination is stored which is intended to be recognized and which can be read by an external electronic processing device in the activated condition of contact means of a control device which is connected to the electronic processing device.

The carrier of a known personal card of the kind set forth (British patent specification No. 1,460,659) comprises a number of parallel electrical conductors which are arranged in columns and which are either interconnected or not interconnected at the area of a row or bit combination by bridge elements of a mechanical or electrical nature. After connection of a row to the electronic processing device by means of the control device and the contact means, the personal card can be processed. The various rows or bit combinations are read by connecting the rows step-wise to the processing device by means of a mechanical transporting device.

The wear of the known personal card is comparatively high due to the mechanical transport of the bit combinations to the read position. Reading, moreover, is time consuming in view of the mechanical transport.

The invention has for its object to provide a personal card whose wear is comparatively low, and which can be quickly read and is also safeguarded against so-called static electrical loading and unintentional application of electrical voltages to the external connection.

SUMMARY OF THE INVENTION

To this end, a personal card in accordance with the invention is characterized in that the bit combination is stored in an integrated solid-state memory which is accommodated on the carrier and which is isolated from its environment in the switched-off condition of a safety switch which is accommodated on the carrier and which is connected electrically in series with the memory, said memory being readable by the external electronic processing device when the safety switch is switched on by the control device and the external connection which is connected electrically in series with the safety switch is contacted by the control device.

The expression personal card has been used in the foregoing in a very broad meaning. In its simplest form, the personal card is only a personal identificaton means. However, the person card may alternatively be a credit means or means for payment. It is also possible to realize access to data banks by means of a personal card. A distinction can be made between personal cards of the passive type and cards of the active type. The personal card of the active type contains means for modifying and/or processing data. A means of this kind may be, for example, a random access read/write memory or a logic arithmetic circuit. The personal card of the passive type contains, for example, only an electronic read-only memory for identification. The personal card can be coupled to a central data processing device, such as a central computer (on-line) or to a decentralized data processing station (off-line).

A special embodiment of a personal card in accordance with the invention is characterized in that the memory comprises a read-only memory and a random access read/write memory. A personal card of this kind enables, for example, a credit balance to be continuously updated, so that the personal card can be used as a credit means.

A further embodiment of a personal card in accordance with the invention is characterized in that the carrier comprises not only the read-only memory and the read/write memory, but also a logic arithmetic circuit which can be coupled to these memories. A personal card comprising its own arithmetic facility enables, for example, extensive decentralization of payment traffic.

A very special embodiment of a personal card in accordance with the invention whose integrated circuits are protected against static electrical charging and unintentional application of electrical voltages to the external connection by means of a comparatively simple and cheap safety switch is furthermore characterized in that the safety switch is formed by a first electrical conductor which is rigidly arranged on the carrier and which is separated by a separator of an electrically insulating material from a second electrical conductor which is provided on and which is covered by a flexible strip of an electrically insulating material, it being possible to bring the second electrical conductor into electrical contact with the first, rigidly arranged electrical conductor through an opening in the separator.

BRIEF DESCRIPTION OF THE DRAWINGS

The invention will be described in detail hereinafter with reference to the drawing.

FIG. 1 is a diagrammatic perspective plan view of a first embodiment of a personal card in accordance with the invention, FIG. 2 is a sectional view of the personal card shown in FIG. 1 which cooperates with a first control device, FIG. 3 is a sectional view at an increased scale of a safety switch of the personal card shown in FIG. 1 which cooperates with the first control device, FIG. 4 is a diagrammatic perspective plan view of a second embodiment of a personal card in accordance with the invention, FIG. 5 is a sectional view of the personal card shown in FIG. 4 which cooperates with a second control device, and FIG. 6 is a sectional view at an increased scale of a safety switch of the personal card shown in FIG. 4 which cooperates with the second control device.

DESCRIPTION OF THE PREFERRED EMBODIMENT

From the personal card 1 shown in the FIGS. 1 and 2 a number of parts which are shown in FIG. 3 have been removed for the sake of simplicity, for example, a supporting plate 3. The personal card 1 comprises a carrier 2 of an electrically insulating material on which an integrated circuit 4 is provided. On the carrier 2 there are provided a number of electrical conductors 5a–f which connect the integrated circuit 4 to a number of safety switches 6a–f. The safety switches 6a–f are connected to six external connections 7a–f provided on the carrier 2. The external connections 7a–f are constructed in a manner customarily used for connectors, i.e. they comprise a widened end portion. As is shown in FIG. 3, the conductors 5a–f as well as the external connections 7a–f terminate in a cavity 8 on the side of the safety switches 6a–f which is situated under a dome-shaped portion 30 of a flexible cover strip 9 of an electrically insulating material. Between the flexible cover strip 9 and the conductors 5a–f there is situated a separator strip 10 of an electrically insulating material. A further strip 11 of an electrically insulating material is situated between the cover strip 9 and the carrier 2. The dome-shaped portion 30 of the cover strip 9 and the strips 10 and 11 ensure that the ends 12 and 13 of the conductors 5a–f and the external connections 7a–f, respectively, are situated at some distance from each other at the area of the cavity 8. This so-called contact distance prevents static charging or electrical voltages on the external connections 7a–f from damaging the integrated circuit 4 in the non-activated condition of the safety switches 6a–f. This is because the wide end portions of the external connections 7a–f are not covered by the cover strip 9. The cover strip preferably extends as far as over the conductors 5a–f and the integrated circuit 4. The external connections 7a–f are connected to the cover strip 9 at the area of the safety switches 6a–f.

The integrated circuit which is diagrammatically shown in FIG. 1 in principle always comprises a so-called integrated solid-state memory. As has already been stated, this may be a read-only memory. If the integrated circuit contains nothing further, the personal card serves exclusively for the identification of the bit combination stored in the read-only memory by the reading of the read-only memory and the subsequent granting of given facilities to the holder of the personal card on the basis of the identification performed. In addition to the read-only memory, the integrated circuit may also comprise a random access read/write memory and a logic arithmetic circuit which can be coupled to both memories. In an embodiment of this kind, for example, a credit balance can be changed in the positive or negative sense.

When used, the personal card is applied to an electronic processing device of a type where electrical contact is made with the wide external connections 7a–f by means of connectors which are known per se. For the sake of simplicity, the drawing (FIG. 3) shows only the control device 14 connected to the electronic processing device. The control device 14 comprises a roller 15 of an electrically insulating, resilient material which presses the ends 12 and 13 of the conductors 5a–f and the external connections 7a–f against each other for all safety switches 6a–f simultaneously (see also FIG. 2). At the instant at which said ends 12 and 13 are pressed against each other, therefore, the wide ends of the external connections 7a–f are also connected to the electronic processing device by means of a connector. Therefore, said contact means of the control device 14 connected to the electronic processing device is formed by the roller 15 which is activated when the ends 12 and 13 of the safety switches 6a–f are pressed together. As has already been stated, the electronic processing device may be a central data processing device such as a central computer as well as a decentralized data processing station.

In the second embodiment of a personal card in accordance with the invention which is shown in the FIGS. 4, 5 and 6 the separate external connections 7a–f are missing. The external connections are in this case combined with the safety switches 6a–f. Wherever possible, the same reference numerals are used in the FIGS. 4, 5 and 6 as in the FIGS. 1, 2 and 3. As appears from FIG. 6, the safety switches 6a–f each comprise a flexible, flat metal plate 7a–f, 13 which is situated at the contact distance from and opposite the end 12 of the conductors 5a–f. The plates 7a–f have a circular shape. The cover strip 9 which is made of an electrically insulating material is combined with the separator strip 10 to the left of the safety switches and with the further strip 11 to the right of the safety switches. The cover strip 9 is interrupted at the area of the metal plates 7a–f which do not project above the surface of the cover strip 9. Instead of the roller 15 of the first embodiment of the personal card, the second embodiment of the personal card comprises six contact pins 16a–f. The contact pins 16a–f are accommodated in the control device 14 and when the personal card is used, they press the metal plates 7a–f, 13 against the ends 12 of the conductors 5a–f. The electrical connection to the electronic processing device (not shown for the sake of simplicity) is thus also established.

The conductors 5a–f and the external connections 7a–f can be realized in known manner, for example, by vapour deposition or by silkscreening. Preferably, safety switches which are composed of layers are used. This offers inter alia the advantage that the ends 12 and 13, forming part of the safety switches 6a–f, of the conductors 5a–f and the external connections 7a–f, respectively can be manufactured by means of the same techniques. The safety switches are preferably of the mechanical type. This means that the elements of such a switch which establish the electrical contact can be made to contact each other by mechanical pressure. In the non-activated condition, a given contact distance exists between the contacting elements of the safety switch. This contact distance is sufficiently large to prevent electrical breakdown due to static charging or a voltage applied to the external connections. Obviously, the areas where external pressure is exerted on the safety switches may have any arbitrary shape, so they are not restricted to circular areas.

A personal card has been described which comprises six external connections 7a–f, each of which comprises a safety switch 6a–f. Whenever external connections are not connected to a vulnerable integrated circuit, obviously, it is not necessary to provide the relevant connections with the safety switch.

Finally, it is to be noted that the use of non-mechanical safety switches is also feasible for as long as these switches themselves are not vulnerable to static charges or unintentional voltages on the external connection and also represent a sufficiently high contact resistance in the direction of the integrated circuits on the carrier.

What is claimed is:

1. A personal card comprising carrier on which a bit combination is stored which is intended to be recognized and which can be read by an external electronic processing device in the activated condition of contact means of a control device which is connected to the electronic processing device, characterized in that the bit combination is stored in an integrated solid-state memory which is accommodated on the carrier and which is isolated from its environment in the switched-off condition of a safety switch which is accommodated on the carrier and which is connected electrically in series with the memory, said memory being electronically readable by the external electronic processing device when the safety switch is switched on by the control device and an external connection which is connected electrically in series with the safety switch is contacted by the control device.

2. A personal card as claimed in claim 1, characterized in that the memory comprises a read-only memory and a random access read/write memory.

3. A personal card as claimed in claim 2, characterized in that the carrier comprises a logic arithmetic circuit which can be coupled to the memory.

4. A personal card as claimed in claim 1, characterized in that the safety switch is a switch which can be activated by mechanical pressure.

5. A personal card as claimed in claim 4, characterized in that the safety switch is formed by a first electrical conductor which is rigidly arranged on the carrier and which is separated by a separator of an electrically insulating material from a second electrical conductor which is provided on and which is covered by a flexible strip of an electrically insulating material, it being possible to bring the second electrical conductor into electrical contact with the first, rigidly arranged electrical conductor by mechanical pressure.

* * * * *